United States Patent [19]

Oh

[11] Patent Number: 5,363,338

[45] Date of Patent: Nov. 8, 1994

[54] WORD LINE DRIVING CIRCUIT FOR DYNAMIC RAM

[75] Inventor: Jong H. Oh, Ichonkun, Rep. of Korea

[73] Assignee: Hyundai Electronics Industries Co., Ltd., Kyoungkido, Rep. of Korea

[21] Appl. No.: 963,810

[22] Filed: Oct. 20, 1992

[30] Foreign Application Priority Data

Oct. 21, 1991 [KR] Rep. of Korea ............. 1991-18516

[51] Int. Cl.⁵ .................. G11C 13/00; G11C 7/00
[52] U.S. Cl. ..................... 365/230.06; 365/189.11
[58] Field of Search ................. 365/230.06, 189.11

[56] References Cited

U.S. PATENT DOCUMENTS 4,437,171 3/1984 Hudson et al. .................. 307/475
4,678,941 7/1987 Chao et al. .............. 365/230.06 X
4,787,066 11/1988 Leuschner .............. 365/189.11 X
4,845,381 7/1989 Cuevas ................... 365/189.11 X
5,202,823 4/1993 Shimogawa .............. 365/230.06
5,214,602 5/1993 Lines ..................... 365/189.11

Primary Examiner—Joseph A. Popek
Assistant Examiner—Son Dinh
Attorney, Agent, or Firm—Darby & Darby

[57] ABSTRACT

A word line driving circuit for a DRAM comprises, a number of CMOS type word line driving stages, a voltage level shifter and a negative transferrer connected between the voltage level shifter and a common gate electrode node of the CMOS type word line driving stages, for applying a voltage signal varying from a driving voltage to a negative voltage below ground potential to the common gate electrode node.

4 Claims, 8 Drawing Sheets

WORD LINE DRIVING CIRCUIT FOR DYNAMIC RAM

FIELD OF THE INVENTION

The present invention relates to a Dynamic RAM (Random Access Memory) and, more particulary, to a circuit for driving word lines in a DRAM.

BACKGROUND OF THE INVENTION

In general, in the case that memory cells in a DRAM consist of N-channel MOS transistors for driving and capacitors for storage, to store a full potential of a power source to a storage node, a signal having a potential which is larger than the potential of the power source by at least a threshold voltage of the N-channel MOS transistor should be transmitted to the storage node.

In a prior would line driving circuit using N-channel MOS transistors, because only N-channel MOS transistors are used, a decrease in area can be achieved. Also, there is no LATCH-UP problem and improved driving speed can be obtained relative to the case that P-channel MOS transistors are used. However, as shown in FIG. 2 illustrating waveforms useful in explaining the operation of the circuit of FIG. 1, it is disadvantageous that a maximum voltage at node 3 is too high. Also, competition between piecharge of the node 3 and rising of select signals Sxn gives rise to trouble. In general, the potential at the node 3 rises up to a potential much higher than power source voltage Vcc by bootstraping operations in twice (presently, in case of 4M DRAM, when Vcc is 5V, maximum voltage at node 3 becomes about 11V.). Therefore, it is difficult to obtain a P-N junction with high reliability at node 3.

In a prior word line driving circuit using CMOS transistors as shown in FIG. 3, an additional driving voltage source Vpp much higher than power source Vcc by at least threshold voltage of the N-channel MOS transistor is used. In the circuit of FIG. 3, it is disadvantageous that, relative to the circuit using N-channel MOS transistors, it is difficult to achieve area reduction and its driving capability degrades. But, it is advantageous that even though a device is shrunk continuously, high reliability of the device can be maintained. Also, because a bootstraping operation is not used, there is no problem related to competition between the precharge at node 14 and the rising of select signals Sxn.

However, because a HOLD-OFF function of maintaining unselected word lines at ground potential (i.e. 0V) against coupling noises is performed by connecting the unselected word lines through a P-channel MOS transistor MP11 to select signal Sxn having ground potential 0V, a voltage at common gate electrode of transistors MP11 and MP12, i.e. at node 14, equals to 0V, and also the potential of the unselect signal Sxn becomes 0V. Therefore, because, during an interval from 0V to the absolute value of the threshold voltage Vtp, the transistor MP11 is ruined-off, these would lines become in OFF state. Thus, it is disadvantageous that an additional HOLD-OFF circuit is required.

SUMMARY OF THE INVENTION

Accordingly it is an object to provide a would line driving circuit without the above-mentioned disadvantages.

According to the present invention, there is provided a word line driving circuit for DRAM comprising; a number of CMOS type would line driving stages; a voltage level shifting means, connected to a driving voltage source Vpp generating a driving voltage much higher than a power source voltage Vcc by at least a threshold voltage of a N-channel MOS transistor used, for applying the driving voltage to a common gate electrode node of the CMOS type driving stages, said transmitting means including two cross-coupled P-channel MOS transistors; and a negative voltage transferring means, connected between the voltage level shifting means and the common gate electrode node of the CMOS type would line driving stages, for applying a voltage signal varying from the driving voltage to a negative voltage below ground potential to the common gate electrode node.

The present invention will be more clearly understood from the following description with reference to the accompanying drawings.

DETAILED DESCRIPTION OF THE INVENTION

Figure 7:
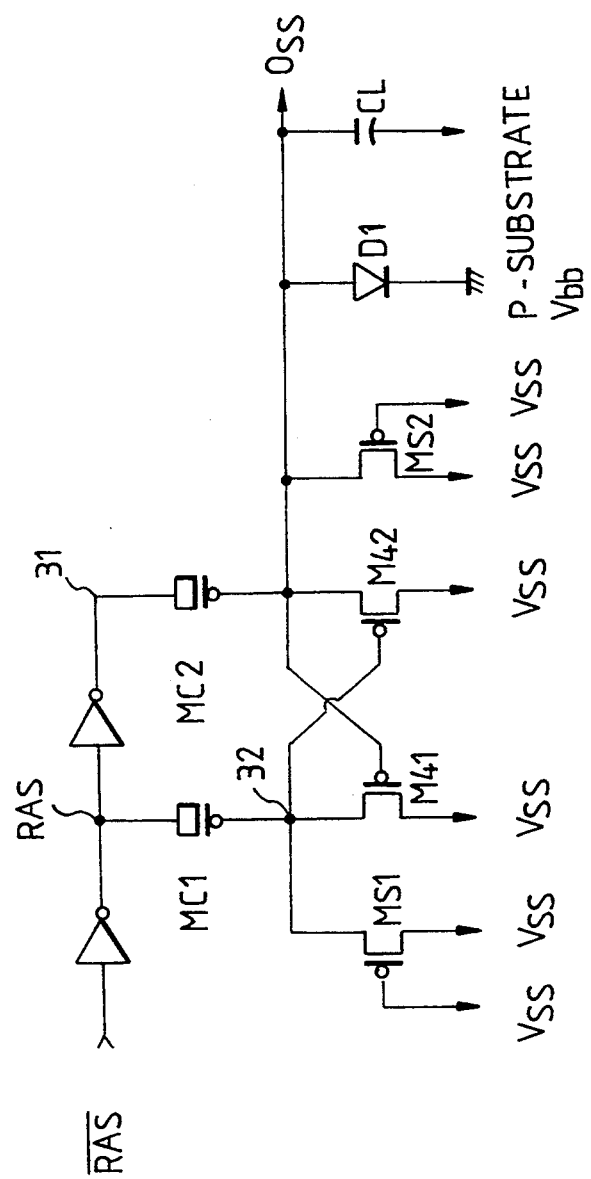
FIG. 7 illustrates an embodiment of a negative voltage signal generating circuit according to the invention.
Figure 8:
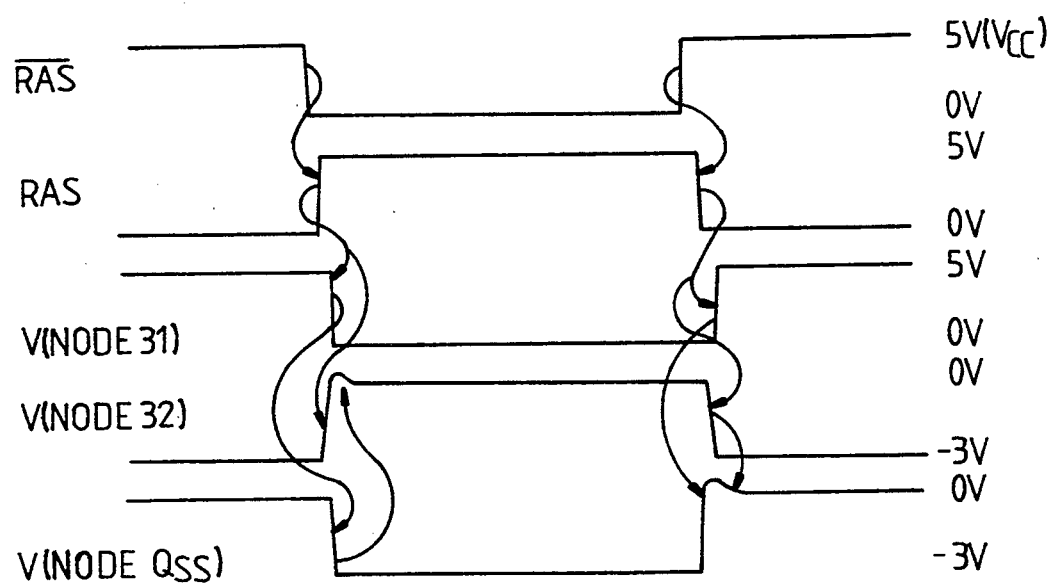
FIG. 8 illustrates waveforms useful in explaining the operation of the circuit of FIG. 7.

Firstly, referring to FIG. 7 and FIG. 8, a negative voltage signal generating circuit shown in FIG. 7 comprises two P-channel MOS capacitors MC1 and MC2 inducing negative voltage at a node Qss by bootstraping operation. External pin input signal RAS and its inverted signal RAS (this signal RAS has a function of determining operating modes of DRAM, namely, when RAS is in "HIGH" state, DRAM is in "STAND-BY" mode and when RAS is in "LOW" state, DRAM operates in normal read/write or refresh modes.) are applied to the capacitors MC1 and MC2 respectively. Also, the circuit comprises two P-channel MOS transistors MS1 and MS2 connected to the capacitors MC1 and MC2 respectively in a same way as PMOS diode connection. These transistors MS1 and MS2 perform a starter function of preventing the circuit from being inactive state upon power-on and causing it to be in initial state. Two cross-coupled P-channel MOS transistors M41 and M42 perform functions of clamping potential at a node 32 and potential at the node Qss to a ground potential Vss (0V) respectively.

As a matter of convenience, supposing that when, in normal state, the potential of the signal RAS is 0V and the potential at node 31 is 5V (Vcc), the potential at the node 32 becomes −3V by the operation of the capacitor MC1, the potential at the node Qss is maintained at 0V by the capacitor MC2 having a gate electrode connected to the node 32. At this time, if the potential of the signal RAS becomes 5V, the potential at the node 32 begins to rise by bootstraping operations of the capacitors MC1 and MC2, and thus the potential at the node Qss begins to fall and, as a result, arrives at −3V. Accordingly, because the transistor M41 is turned-on, the potential at the node 32 is clamped to 0V. The minimum voltage value at the node Qss is determined by the potential induced by the capacitor MC2 and the potential charged in a capacitor CL and thus it can be adjusted appropriately. However, in the case that the minimum voltage value at the node Qss is much lower than the P-type substrate voltage Vbb, P-N junction diodes forming drains and sources of respective P-channel MOS transistors are turned-on, which, consequently, tends to cause a LATCH-UP state. Accordingly, the circuit shown in FIG. 7 comprises a diode D1 for clamping the potential at the node Qss to the P-type substrate voltage Vbb.

Figure 5:
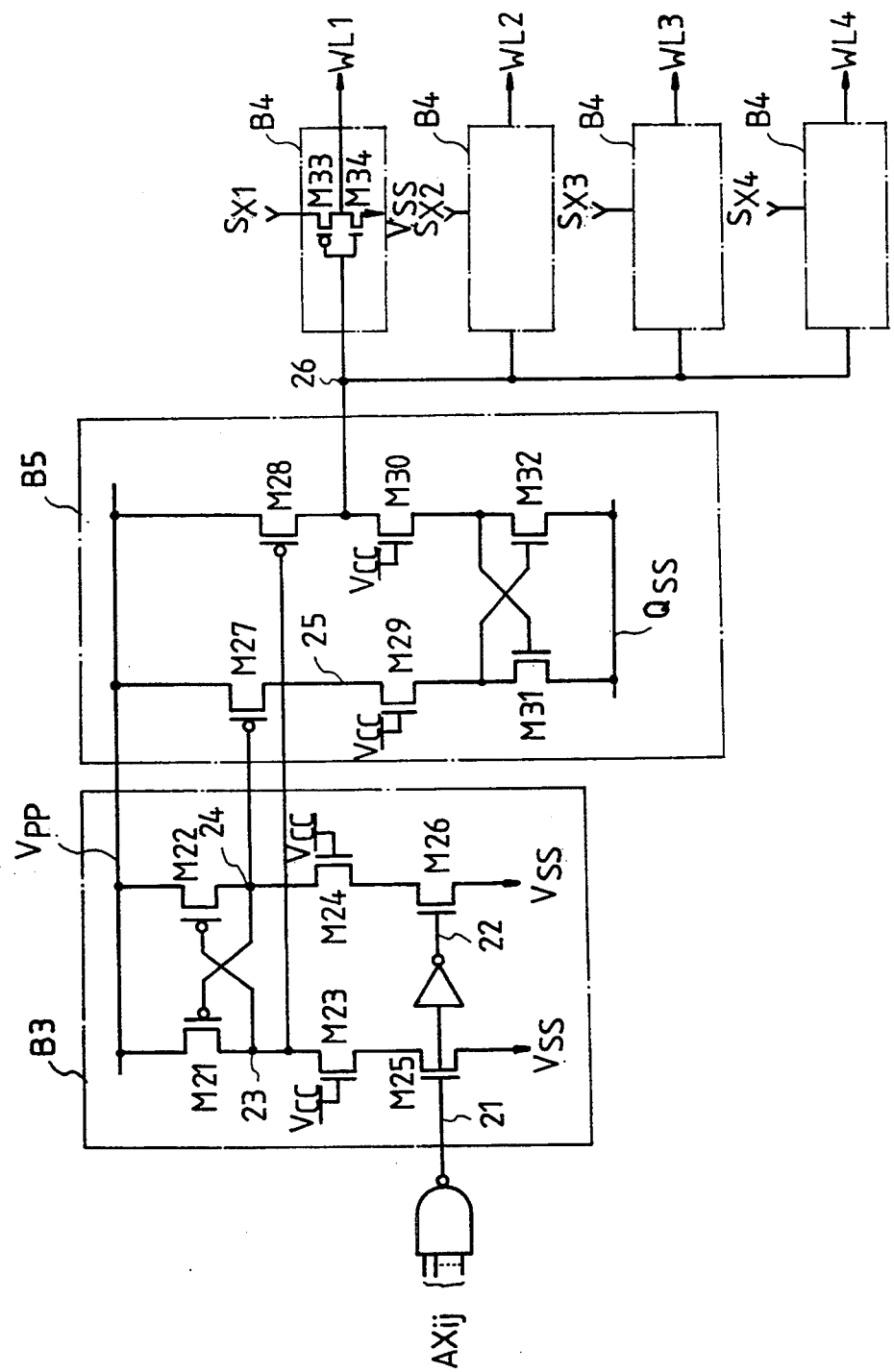
FIG. 5 illustrates an embodiment of a word line driving circuit according to the invention.

The negative(−) voltage signal Qss at the node Qss generated as described above is transmitted to a node 26 connected to the common gate electrode of word line driving stages B4 in the circuit shown in FIG. 5.

Figure 6:
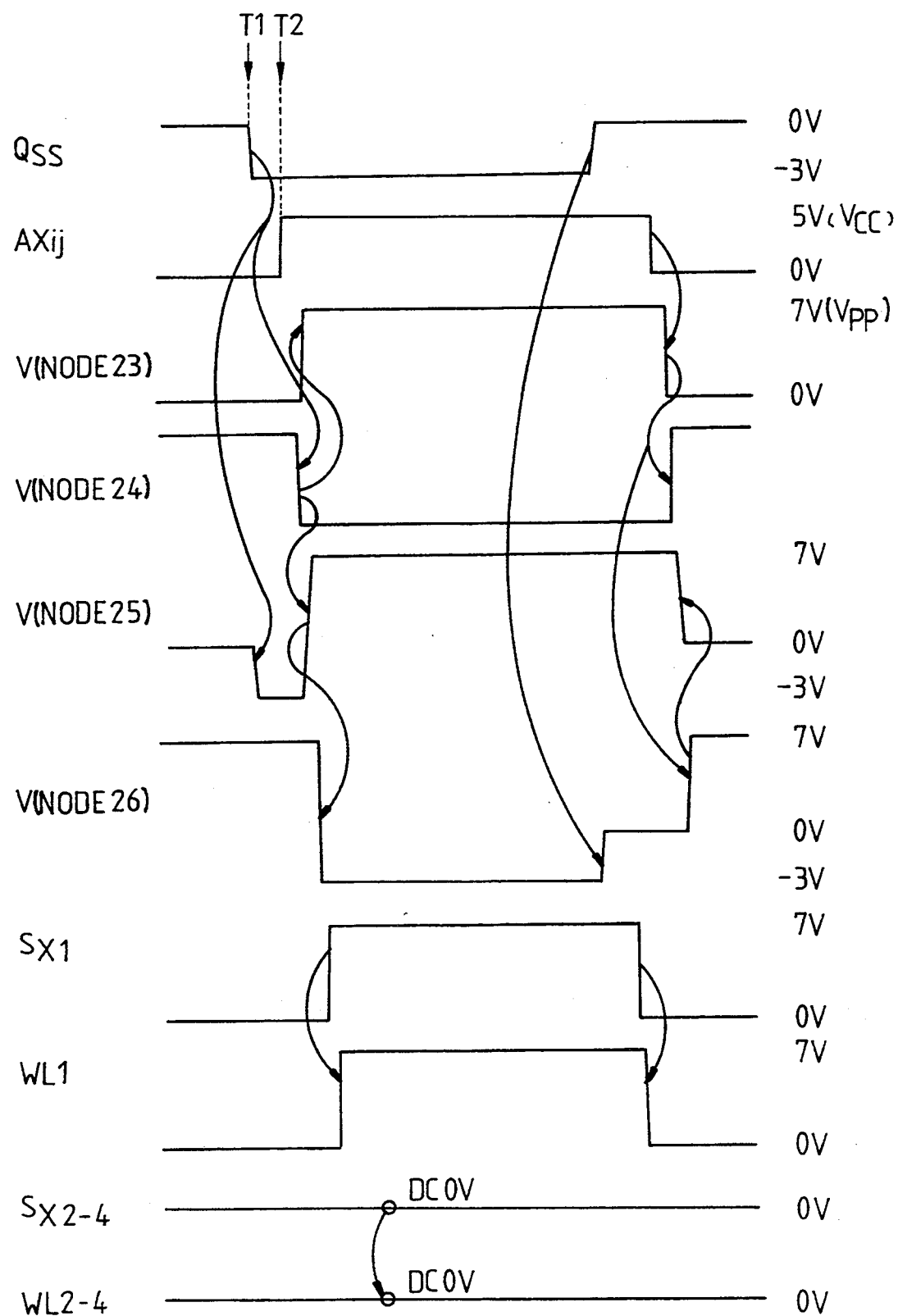
FIG. 6 illustrates waveforms useful in explaining the operation of the circuit of FIG. 5.

FIG. 5 illustrates a word line driving circuit according to the invention and FIG. 6 illustrates waveforms useful in explaining its operation. As a matter of convenience, by way of example, let suppose that Vcc equals to 5V, Vpp equals to 7V and the minimum voltage value of the signal Qss equals to −3V. In FIG. 6, because, before time T1, row decoder input AXij is in "Low" state, the row decoder B1 is in STAND-BY mode and the potential of the signal Qss becomes 0V. At this time, because the potential at a node 21 and the potential at a node 22 are 5V and 0V respectively, the potential at a node 23 becomes 0V and the potential at a node 24 becomes 7V. Therefore, a P-channel MOS capacitor M27 is turned-off and a P-channel MOS capacitor M28 is turned-on. At this time, because the potential at the node 26 is maintained at 7V by the transistor M28, all N-channel MOS transistors arranged in same positions as the transistor M34 are turned-on and thus all word lines maintain 0V. At time T1, when the potential of the signal Qss becomes −3V, this potential (−3V) is transmitted to the node 25 without loss through two cross-coupled N-channel MOS transistors M31 and M32.

On arriving at time T2, if the row decoder B1 is selected by input row address combination, the potential at the node 21 becomes 0V and the potential at the node 22 becomes 5V. AT this time, the transistor 25 is turned-off and the transistor M26 is turned-on. Therefore, the transistor 27 is turned-on and the transistor M28 is turned-off. Subsequently, the potential at the node 25 becomes 7V and thus turns-on the transistor M27. At this time, to the node 26, the voltage of −3V is applied. Accordingly all P-channel MOS transistors arranged in same positions as the transistor M33 are turned-on and thus the select signals Sx1–4 are applied to word lines WL1–4. At this time, the potential of the select signal Sxn applied to the selected word line of these word lines is 7V and then applied to the selected word line through the P-channel MOS transistor M33 which is turned-on by the potential (−3V) at the node 26. The potentials of select signals Sxn applied to the unselected word lines are 0V and the potential of at the node 26 is −3V. Accordingly, the unselected word lines are maintained at 0V by the potentials (0V) of the select signals Sxn, and thus the HOLD-OFF function of the unselected word lines is performed.

Figure 1:
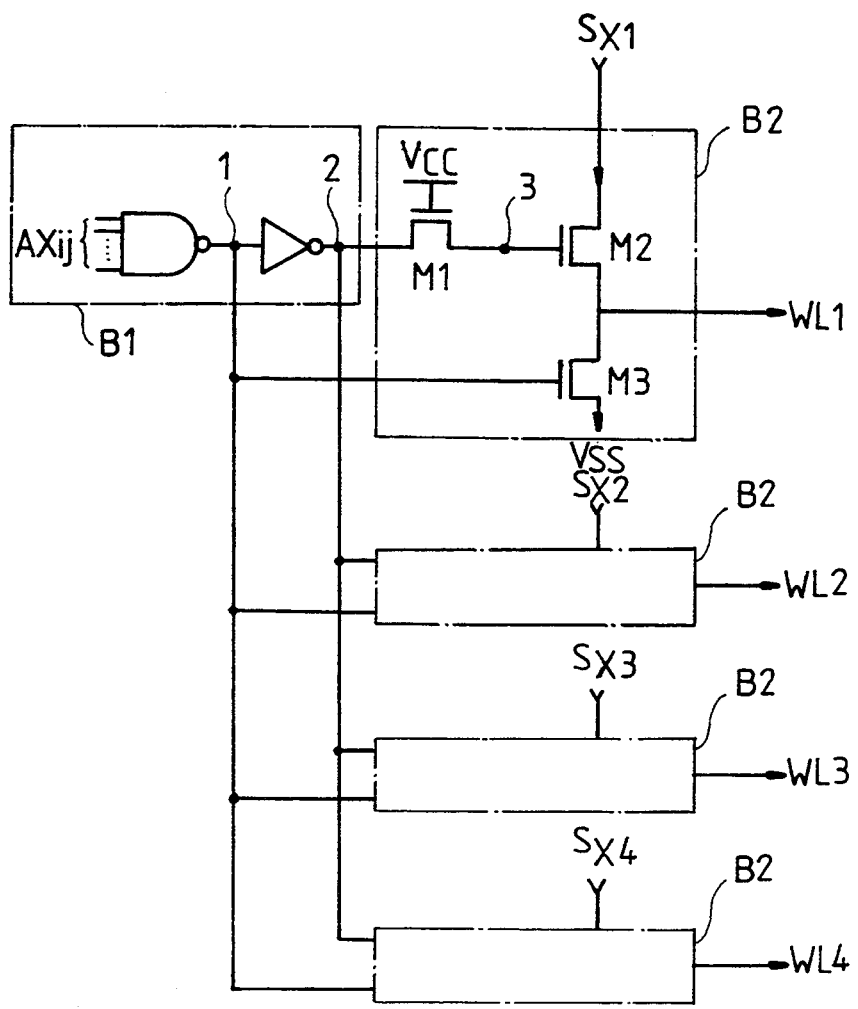
FIG. 1 illustrates a conventional word line driving circuit using N-channel MOS transistors.
Figure 2:
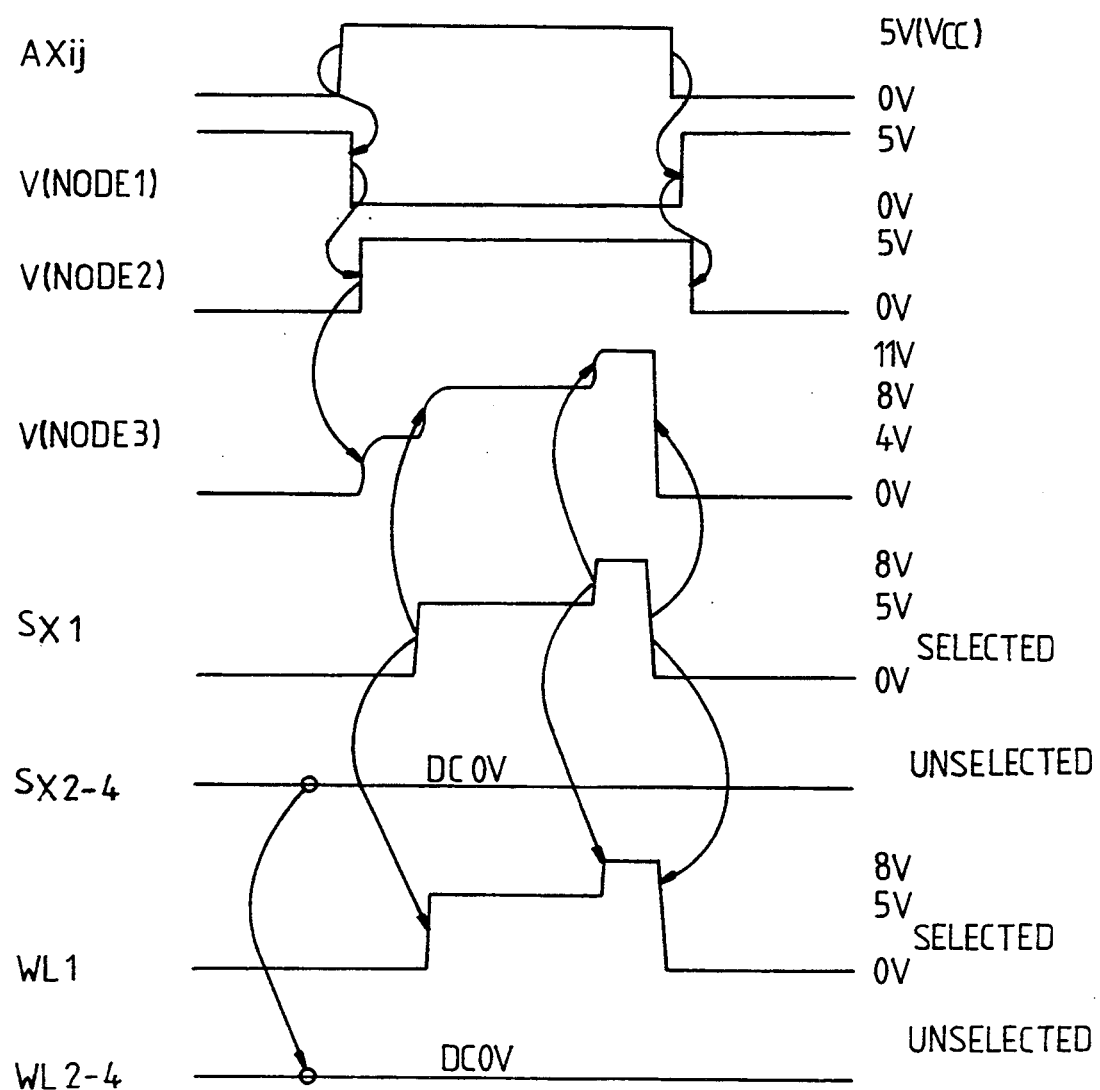
FIG. 2 illustrates waveforms useful in explaining the operation of the circuit of FIG. 1.
Figure 3:
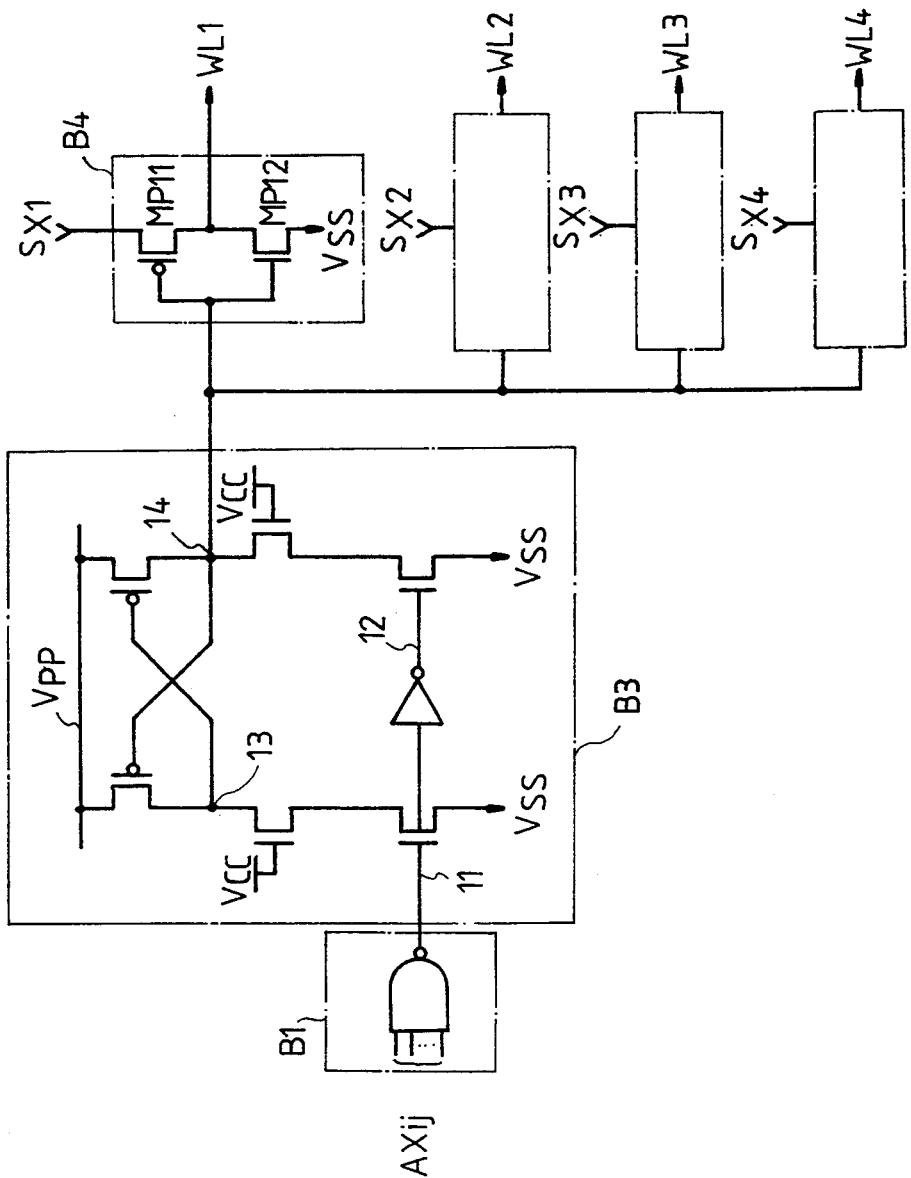
FIG. 3 illustrates a conventional word line driving circuit using CMOS transistors.
Figure 4:
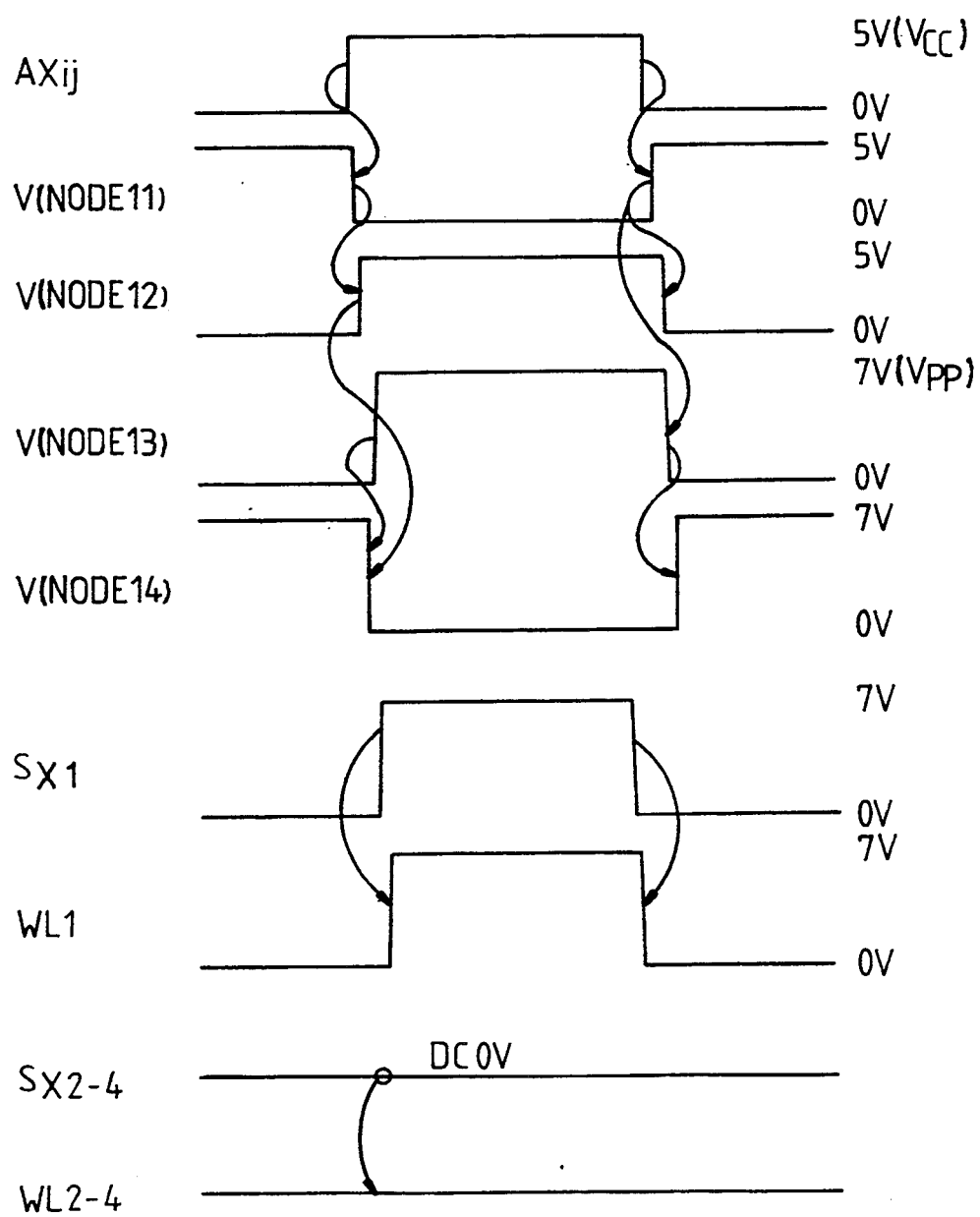
FIG. 4 illustrates waveforms useful in explaining the operation of the circuit of FIG. 3.

Accordingly, in the word line driving circuit for dynamic RAM according to the invention, although six transistors M27–M32 are added relative to the conventional word line driving circuit shown in FIG. 3, such increase in area can be compensated, because an additional HOLD-OFF circuit is not required. Therefore, in VLSI semiconductor devices implemented using the word line driving circuit according to the invention, it is advantageous that high reliability of devices can be obtained, the HOLD-OFF function of the word lines can be performed against coupling noises due to very closely arranged word lines without an additional HOLD-OFF circuit, and because the voltage range of the signal applied to the P-channel MOS transistor for driving the word lines is enlarged, the word lines can be driven more quickly.

I claim:
1. A word line driving circuit for a dynamic RAM comprising,
   a number of CMOS type word line driving stages each including a P-channel MOS transistor and an N-channel MOS transistor;
   a driving voltage source for generating a driving voltage much higher than a power source voltage by at least a threshold voltage of said N-channel MOS transistor;
   a voltage level shifting means, connected to the driving voltage source for applying the driving voltage to a common gate electrode node of the CMOS type driving stages;
   a means for generating a negative (−) voltage signal which varies between a ground voltage level and a predetermined negative voltage level below the ground voltage level; and
   a negative voltage transferring means, connected to the voltage level shifting means, the means for generating a negative (−) voltage signal and the common gate electrode node of the CMOS type word line driving stages, for applying a voltage signal which varies between the driving voltage level and the negative voltage level, to the common gate electrode node.

2. A word line driving circuit as set forth in claim 1, wherein said voltage level shifting means including two cross-coupled P-channel MOS transistors and wherein said negative voltage transferring means includes:
   first and second P-channel MOS transistors connected to the driving voltage source, and gates of which are connected to the cross-coupled P-channel MOS transistors respectively;
   first and second N-channel MOS transistors connected to the first and second P-channel MOS transistors respectively, and gates of which are connected to the power source; and
   third and fourth cross-coupled N-channel MOS transistors connected to the first and second N-channel MOS transistors respectively and to the means for generating a negative voltage signal.

3. A word line driving circuit comprising:
   a number of CMOS type word line driving stages,
   a voltage level shifting means, connected to a driving voltage source generating a driving voltage much higher than a power source voltage by at least a threshold voltage of a N-channel MOS transistor used, for applying the driving voltage to a common gate electrode node of the CMOS type driving stages, said shifting means including two cross-coupled P-channel MOS transistors, and a negative voltage transferring means, arranged between the high voltage level transmitting means and the common gate electrode node of the CMOS type word line driving stages, for applying a voltage signal varying from the driving voltage to a negative voltage below ground potential to the common gate electrode node, said negative voltage transferring means comprises, first and second P-channel MOS transistors connected to the driving voltage source, and gates of which are connected to the cross-coupled P-channel MOS transistors respectively, first and second N-channel MOS transistors connected to the first and second P-channel MOS transistors respectively, and gates of which are connected to the power source, third and fourth cross-coupled N-channel MOS transistors connected to the first and second N-channel MOS transistors respectively, and a negative (−) voltage signal generating means connected to a common source electrode node of the third and fourth cross-coupled N-channel MOS transistors, said negative voltage signal generating means comprises, first and second P-channel MOS capacitors for inducing the negative voltage at a output node of the negative voltage signal transmitting means and to each of which an external pin input signal and its inverted signal are applied respectively, third and forth P-channel MOS transistors, connected to the first and second P-channel MOS capacitors respectively each in PMOS diode connection, for performing a starter function by preventing the circuit from being in an inactive state upon power-on and cause it to be in initial state, fifth and sixth cross-coupled P-channel MOS transistors for clamping a potential at nodes forming contacts with the first and second P-channel MOS capacitors to a ground potential, a diode, connected to the output node, for clamping a potential at the output node to a substrate voltage, and a capacitor connected to the diode in parallel.

4. A word line driving circuit as set forth in claim 2, wherein said means for generating a negative voltage signal comprises:

first and second P-channel MOS capacitors for inducing the negative voltage at an output node of the negative voltage signal transferring means and to each of which an external pin input signal and its inverted signal are applied respectively, third and forth P-channel MOS transistors, connected to the first and second P-channel MOS capacitors respectively in PMOS diode connection, for performing a starter function by preventing the circuit from being in inactive state upon power-on and cause it to be in initial state, fifth and sixth cross-coupled P-channel MOS transistors for clamping a potential at nodes forming contacts with the first and second P-channel MOS capacitors to a ground potential;

a diode, connected to the output node, for clamping a potential at the output node to a substrate voltage; and a capacitor connected to the diode in parallel.

* * * * *